United States Patent
Kobayashi et al.

(10) Patent No.: US 9,769,916 B2
(45) Date of Patent: Sep. 19, 2017

(54) PRINTED CIRCUIT BOARD AND ELECTRONIC DEVICE

(71) Applicants: OMRON AUTOMOTIVE ELECTRONICS CO., LTD., Aichi (JP); AIKOKIKI MANUFACTURING CO., LTD., Aichi (JP)

(72) Inventors: Tomoyoshi Kobayashi, Aichi (JP); Masato Kasashima, Aichi (JP); Koichi Suzuki, Aichi (JP)

(73) Assignees: OMRON AUTOMOTIVE ELECTRONICS CO., LTD., Aichi (JP); AIKOKIKI MANUFACTURING CO., LTD., Aichi (JP)

( * ) Notice: Subject to any disclaimer, the term of this patent is extended or adjusted under 35 U.S.C. 154(b) by 0 days.

(21) Appl. No.: 15/175,732

(22) Filed: Jun. 7, 2016

(65) Prior Publication Data
US 2016/0366757 A1  Dec. 15, 2016

(30) Foreign Application Priority Data

Jun. 11, 2015 (JP) .................. 2015-118116

(51) Int. Cl.
*H05K 7/20* (2006.01)
*H05K 1/02* (2006.01)
(Continued)

(52) U.S. Cl.
CPC ......... *H05K 1/0204* (2013.01); *H05K 1/0298* (2013.01); *H05K 1/111* (2013.01);
(Continued)

(58) Field of Classification Search
CPC . G06F 1/181–1/182; H05K 7/20218–7/20381;
(Continued)

(56) References Cited

U.S. PATENT DOCUMENTS

| 2003/0002260 A1* | 1/2003 | Hasebe | H01L 23/142 |
| | | | 361/720 |
| 2004/0001319 A1* | 1/2004 | Kawakita | H05K 1/0263 |
| | | | 361/715 |

(Continued)

FOREIGN PATENT DOCUMENTS

| JP | 2001-044312 A | 2/2001 |
| JP | 2007-036013 A | 2/2007 |

(Continued)

*Primary Examiner* — Anthony Haughton
*Assistant Examiner* — Razmeen Gafur
(74) *Attorney, Agent, or Firm* — Osha Liang LLP

(57) ABSTRACT

A printed circuit board includes a first insulating layer having mounting regions for electronic components and wiring patterns provided on an upper surface, a second insulating layer provided so as to be in contact with a lower surface of the first insulating layer, and a metal core embedded in the second insulating layer so as to vertically overlap the mounting regions. The metal core is formed into a predetermined shape by stamping out a metal plate. One outer surface orthogonal to the thickness direction of the metal core is a protruding surface having a curved portion formed at its edge, and is in contact with the lower surface of the first insulating layer. The other outer surface orthogonal to the thickness direction of the metal core is a recessed surface having a protruding portion formed at its edge, and is exposed from a lower surface of the second insulating layer.

9 Claims, 8 Drawing Sheets

(51) Int. Cl.
*H05K 1/11* (2006.01)
*H05K 1/18* (2006.01)
*H01L 23/473* (2006.01)

(52) U.S. Cl.
CPC ............. *H05K 1/115* (2013.01); *H05K 1/181* (2013.01); *H05K 2201/10015* (2013.01); *H05K 2201/10166* (2013.01); *H05K 2201/10409* (2013.01); *H05K 2201/10416* (2013.01)

(58) Field of Classification Search
CPC ........................ H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2008/0030961 A1* | 2/2008 | Koo | .................... | H05K 1/0216 361/720 |
| 2008/0224257 A1* | 9/2008 | Mori | ................. | H01L 21/76283 257/507 |
| 2008/0253090 A1* | 10/2008 | Janisch | ............... | H01L 23/3677 361/709 |
| 2009/0045487 A1* | 2/2009 | Jung | ................. | H01L 21/76898 257/621 |
| 2009/0080152 A1* | 3/2009 | Conn | .................... | H01L 24/29 361/679.53 |
| 2009/0086431 A1* | 4/2009 | Sakamoto | .......... | H05K 7/20009 361/695 |
| 2009/0109624 A1* | 4/2009 | Chan | .................... | H05K 1/0206 361/702 |
| 2009/0296349 A1* | 12/2009 | Suzuki | ................. | H05K 1/0206 361/705 |
| 2011/0085304 A1* | 4/2011 | Bindrup | .............. | H01L 21/4871 361/718 |
| 2011/0194255 A1* | 8/2011 | Yamashita | ........... | B23K 1/0016 361/711 |
| 2011/0304990 A1* | 12/2011 | Lim | ...................... | H05K 1/0203 361/717 |
| 2012/0069523 A1* | 3/2012 | Kapusta | ............... | H05K 1/0218 361/704 |
| 2013/0286593 A1* | 10/2013 | Cho | ........................ | B06B 1/0292 361/707 |
| 2013/0329370 A1* | 12/2013 | Gottwald | ........... | H01L 23/5389 361/720 |
| 2014/0133105 A1* | 5/2014 | Yee | .................... | H05K 7/20509 361/720 |
| 2014/0159222 A1* | 6/2014 | Hong | ...................... | H01L 23/13 257/686 |
| 2014/0160681 A1* | 6/2014 | Chen | .................... | H01R 12/737 361/704 |
| 2014/0160684 A1* | 6/2014 | Wittenberg | .......... | H05K 1/0203 361/719 |
| 2014/0226283 A1* | 8/2014 | Kim | ...................... | H05K 1/0201 361/720 |
| 2014/0355213 A1* | 12/2014 | Bettoni | ................ | H05K 1/0206 361/711 |
| 2014/0362535 A1* | 12/2014 | Meier | .................... | H05K 1/141 361/707 |
| 2015/0228591 A1* | 8/2015 | Kim | ........................ | H01L 24/17 257/692 |
| 2015/0257249 A1* | 9/2015 | Kim | .................... | H05K 1/0204 361/700 |

FOREIGN PATENT DOCUMENTS

| | | |
|---|---|---|
| JP | 2007-036050 A | 2/2007 |
| JP | 2007-088365 A | 4/2007 |
| JP | 2008-311294 A | 12/2008 |
| JP | 2014-063875 A | 4/2014 |
| JP | 2014-179416 A | 9/2014 |

* cited by examiner

A-A CROSS-SECTION

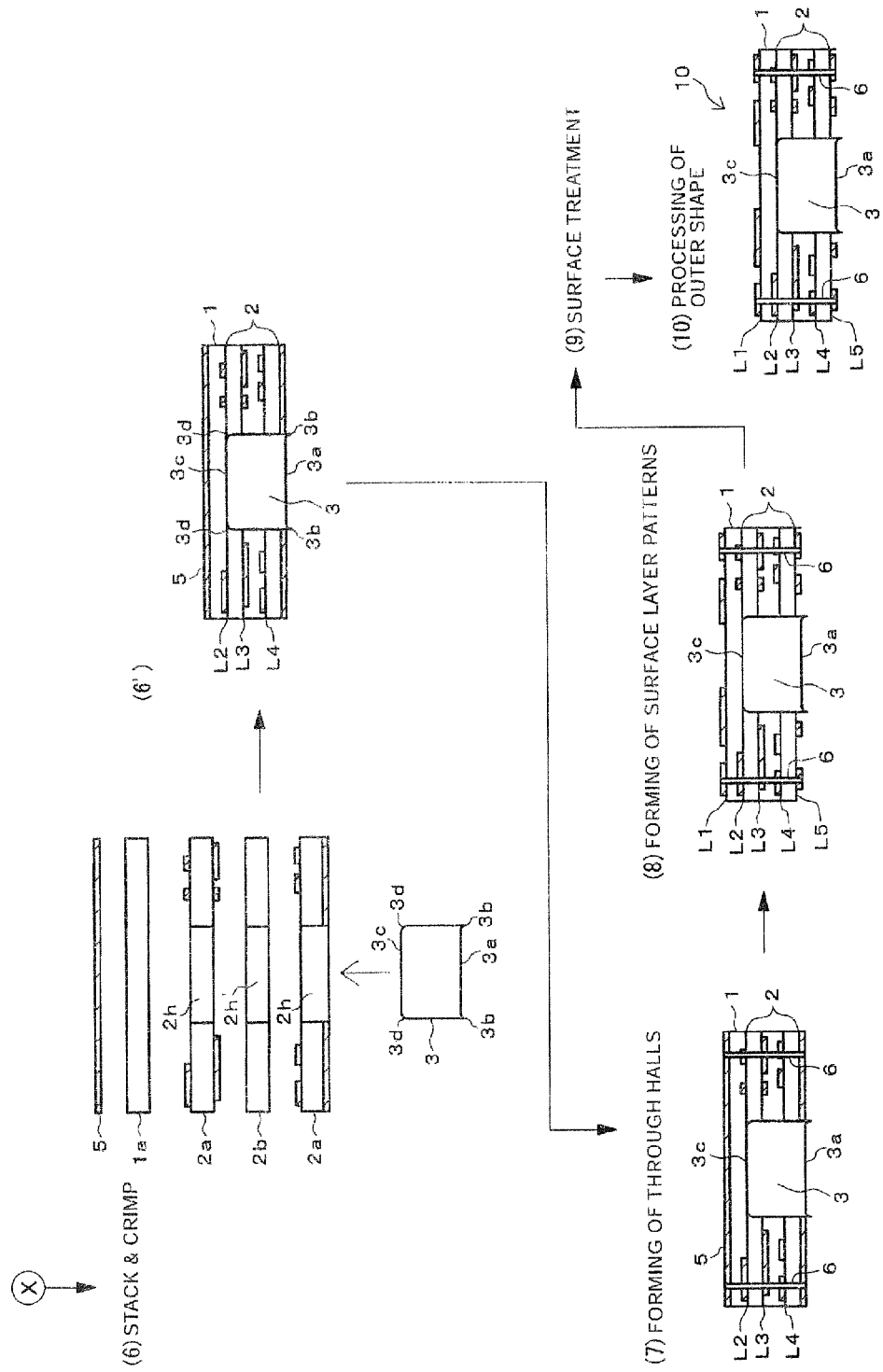

PRINTED CIRCUIT BOARD AND ELECTRONIC DEVICE

BACKGROUND OF THE INVENTION (1) Field of the Invention

The present invention relates to a structure for dissipating heat generated by an electronic component mounted on a printed circuit board through a heat transfer member embedded in the printed circuit board.

(2) Description of Related Art

There are proposed various techniques for embedding a heat transfer member in a printed circuit board in order to dissipate heat generated by an electronic component mounted on the printed circuit board.

For example, according to each of Patent Documents 1 to 3, a heat transfer member made of metal such as copper is embedded in an insulating layer of a printed circuit board, and an electronic component that generates heat is mounted above the heat transfer member.

According to Patent Document 1, a wiring pattern is provided on each of upper and lower surfaces and inside of the printed circuit board, and the electronic component is mounted on the wiring pattern on the upper surface which is electrically connected to the heat transfer member. A lower surface of the heat transfer member is covered with the highly thermally conductive insulating layer, and a heat dissipation member is provided so as to be in contact with a lower surface of the insulating layer. Heat generated by the electronic component is thereby transferred to the heat dissipation member through the wiring pattern on the upper surface, the heat transfer member and the highly thermally conductive insulating layer, and is dissipated from the heat dissipation member to the outside.

According to Patent Document 2, a lower surface of the heat transfer member is exposed from the insulating layer of the printed circuit board, and the electronic component is mounted above the heat transfer member through the highly thermally conductive insulating layer and a wiring pattern. Heat generated by the electronic component is thereby dissipated from the exposed lower surface of the heat transfer member to the outside through the wiring pattern, the highly thermally conductive insulating layer and the heat transfer member.

According to Patent Document 3, upper and lower surfaces of the heat transfer member are exposed from the insulating layer of the printed circuit board, and the electronic component is mounted above the heat transfer member through solder. Moreover, a heat dissipation member is provided on lower surfaces of the printed circuit board and the heat transfer member through a heat transfer material such as heat dissipation grease. Heat generated by the electronic component is thereby transferred to the heat dissipation member through the solder, the heat transfer member and the heat transfer material, and is dissipated from the heat dissipation member to the outside.

Now, as disclosed in Patent Document 3, for example, the heat transfer member can be formed easily into a predetermined shape by stamping out a metal plate in a thickness direction (stamping). In this case, one outer surface orthogonal to the thickness direction of the heat transfer member becomes a protruding surface having a curved portion (a so-called "shear droop") caused at its edge, and the other outer surface orthogonal to the thickness direction of the heat transfer member becomes a recessed surface having a protruding portion (a so-called "burr") caused at its edge.

According to Patent Document 3, in order to prevent the solder from flowing out from between the heat transfer member and the electronic component, the recessed surface of the heat transfer member is exposed from the upper surface of the printed circuit board so as to face the electronic component. Moreover, the protruding surface of the heat transfer member is exposed from the lower surface of the printed circuit board so as to face the heat dissipation member.

Moreover, outer shapes of a metal substrate as disclosed in Patent Documents 4 to 6 and a metal stiffener as disclosed in Patent Document 7 are also formed by stamping out a metal plate in a thickness direction. Then, one outer surface orthogonal to the thickness direction thereof becomes a protruding surface having a shear droop, and the other outer surface becomes a recessed surface having a burr.

According to each of Patent Documents 4 and 5, the recessed surface of the metal substrate is placed on an upper surface of a heat dissipation member through heat dissipation grease or solder. According to Patent Document 7, the recessed surface of the metal stiffener is placed on an upper surface of a wiring board through an adhesive. According to Patent Document 6, a groove is provided on an upper surface of the metal substrate, and the metal substrate is stamped out at the groove, and a burr is caused inside of the groove. Then, a wiring pattern is provided on the upper surface of the metal substrate except for the groove, and an electronic component is mounted.

CITATION LIST

Patent Documents

Patent Document 1: JP 2007-36050 A
Patent Document 2: JP 2014-179416 A
Patent Document 3: JP 2014-63875 A
Patent Document 4: JP 2007-88365 A
Patent Document 5: JP 2008-311294 A
Patent Document 6: JP 2007-36013 A
Patent Document 7: JP 2001-44312 A

SUMMARY OF THE INVENTION

For example, as shown in FIG. 6, in the case where a heat transfer member 53 is embedded in a printed circuit board 50, an electronic component 59 is disposed above the heat transfer member 53, and a lower surface of the heat transfer member 53 is exposed from an insulating layer 52 of the printed circuit board 50, heat generated by the electronic component 59 can be dissipated to below the printed circuit board 50 through the insulating layer 51 and the heat transfer member 53 (see also Patent Documents 2 and 3). However, since a recessed surface 53a of the heat transfer member 53, which has a burr 53b, faces toward the electronic component 59, the burr 53b bites into the insulating layer 51 present between the electronic component 59 and the heat transfer member 53 and damages the insulating layer 51, thereby insulation performance and heat transfer performance of the printed circuit board 50 are possibly impaired.

One or more embodiments of the invention can efficiently dissipate heat generated by an electronic component mounted on a printed circuit board, and to prevent insulation performance of the printed circuit board from being impaired.

A printed circuit board according to one or more embodiments of the present invention includes a first insulating layer having a mounting region for an electronic component and a wiring pattern provided on an upper surface, a second insulating layer provided so as to be in contact with a lower surface of the first insulating layer, and a heat transfer member embedded in the second insulating layer so as to vertically overlap the mounting region. The heat transfer member is formed into a predetermined shape by cutting a metal plate. One outer surface orthogonal to a thickness direction of the heat transfer member is a protruding surface having a curved portion (shear droop) formed at its edge, and is in contact with the lower surface of the first insulating layer. The other outer surface orthogonal to the thickness direction of the heat transfer member is a recessed surface having a protruding portion (burr) formed at its edge, and is exposed from a lower surface of the second insulating layer.

According to one or more embodiments of the present invention, the heat transfer member is embedded in the second insulating layer of the printed circuit board, the electronic component is mounted above the heat transfer member through the first insulating layer, the protruding surface of the heat transfer member, on which the curved portion is formed, is in contact with the lower surface of the first insulating layer, and the recessed surface of the heat transfer member, on which the protruding portion is formed, is exposed from the lower surface of the second insulating layer. Accordingly, the protruding surface of the heat transfer member can be brought into close contact with the first insulating layer to easily transfer heat generated by the electronic component to the heat transfer member through the first insulating layer, and the heat can be dissipated efficiently from the recessed surface of the heat transfer member to the outside. Moreover, since the protruding portion of the heat transfer member is disposed toward the outside of the printed circuit board, the first insulating layer is prevented from being damaged by the protruding portion, and insulation performance of the first insulating layer insulating the electronic component and the wiring pattern on the printed circuit board from the heat transfer member can be prevented from being impaired.

In the printed circuit board according to one or more embodiments of the present invention, the recessed surface of the heat transfer member may be in contact with a heat dissipation member that is provided below the second insulating layer.

Moreover, in the printed circuit board according to one or more embodiments of the present invention, a thermal conductivity of the first insulating layer may be higher than a thermal conductivity of the second insulating layer, and a thermal conductivity of the heat transfer member may be higher than the thermal conductivity of the first insulating layer.

Moreover, in the printed circuit board according to one or more embodiments of the present invention, the second insulating layer may have a laminate structure, and a wiring pattern may be provided on each of a first inner layer that is present between the first insulating layer and the second insulating layer, and a second inner layer that is present inside of the second insulating layer. In this case, the wiring patterns on the inner layers are insulated from the heat transfer member.

Moreover, in the printed circuit board according to one or more embodiments of the present invention, a mounting region for an electronic component and a wiring pattern may be provided on the lower surface of the second insulating layer. In this case, the mounting region and the wiring pattern on the lower surface of the second insulating layer are insulated from the heat transfer member.

Moreover, the printed circuit board according to one or more embodiments of the present invention may further include a through conductor penetrating the first insulating layer and the second insulating layer to connect the wiring patterns present on both the insulating layers. In this case, the through conductor is insulated from the heat transfer member.

An electronic device according to one or more embodiments of the present invention includes the printed circuit board described above, an electronic component that generates heat, which is mounted in the mounting region of the printed circuit board, and a heat dissipation member provided below the printed circuit board. A first base protruding upward is provided on an upper surface of the heat dissipation member, and the first base is in contact with a region inside of the protruding portion on the recessed surface of the heat transfer member provided on the printed circuit board.

In the electronic device according to one or more embodiments of the present invention, an indentation for avoiding an electronic component and a wiring pattern provided on a lower surface of the second insulating layer of the printed circuit board and the protruding portion on the recessed surface of the heat transfer member is provided on the upper surface of the heat dissipation member.

In the electronic device according to one or more embodiments of the present invention, a penetration hole may be provided in a non-overlapping region not overlapping the mounting region, the wiring pattern and the heat transfer member of the printed circuit board, a second base protruding upward may be provided on the upper surface of the heat dissipation member, separately from the first base, the second base may be in contact with the non-overlapping region of the printed circuit board, a threaded hole may be provided on the second base so as to be in communicating with the penetration hole, and the printed circuit board may be fixed on the heat dissipation member by a screw member penetrating the penetration hole from above the printed circuit board and being screwed into the threaded hole.

According to one or more embodiments of the present invention, heat generated by an electronic component mounted on a printed circuit board can be dissipated efficiently, and insulation performance of the printed circuit board can be prevented from being impaired.

BRIEF DESCRIPTION OF THE DRAWINGS

FIG. 5B is a diagram showing subsequent steps of the manufacturing steps in FIG. 5A;

DETAILED DESCRIPTION OF EMBODIMENTS

Figure 1:
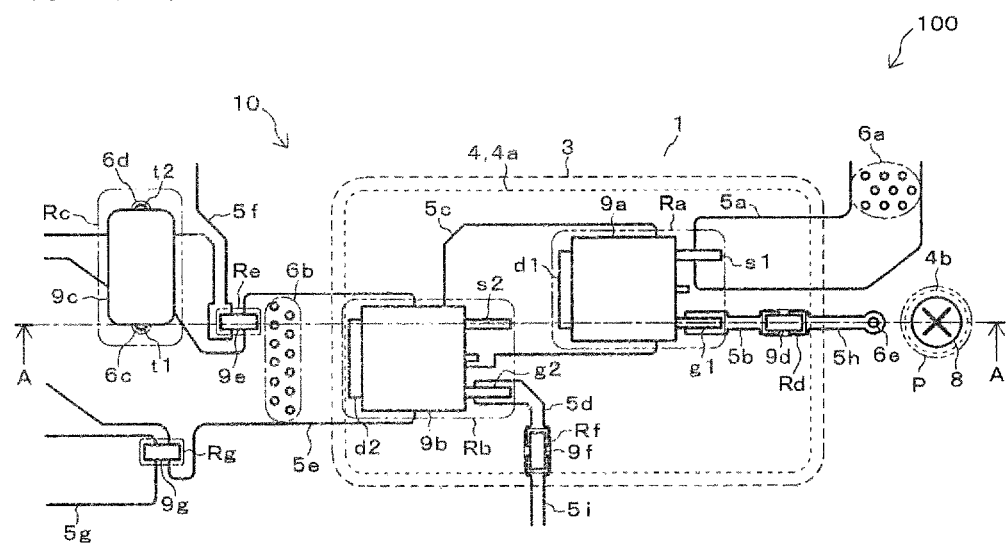
FIG. 1 is a diagram showing a top layer of a printed circuit board in one or more embodiments of the present invention.

Hereinafter, embodiments of the present invention will be described with reference to the drawings. In the drawings, the same parts or corresponding parts are denoted by the same reference signs.

First, structures of a printed circuit board 10 and an electronic device 100 in an embodiment will be described with reference to FIGS. 1 to 4.

Figure 2:
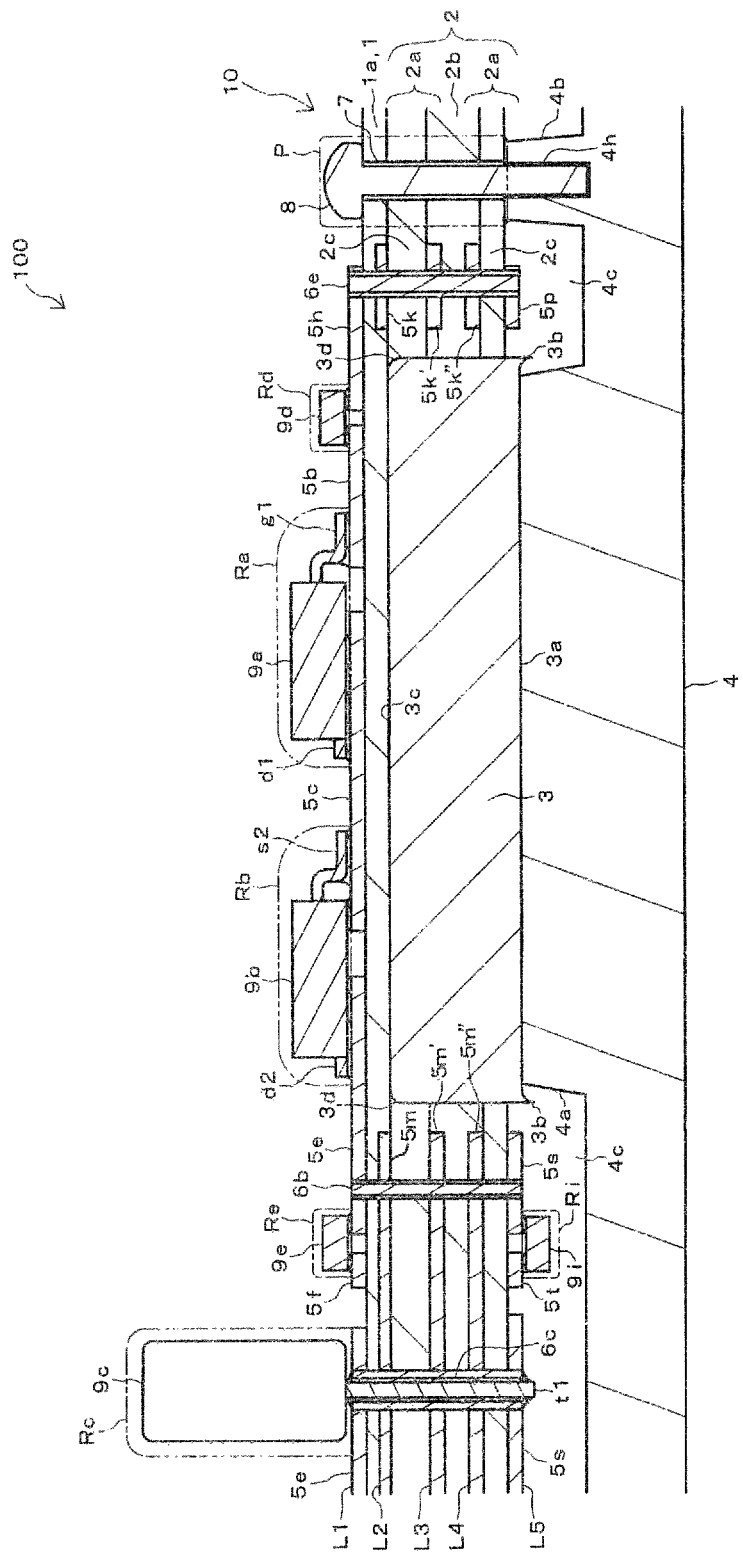
FIG. 2 is a diagram showing a cross-section along A-A in FIG. 1.
Figure 3:
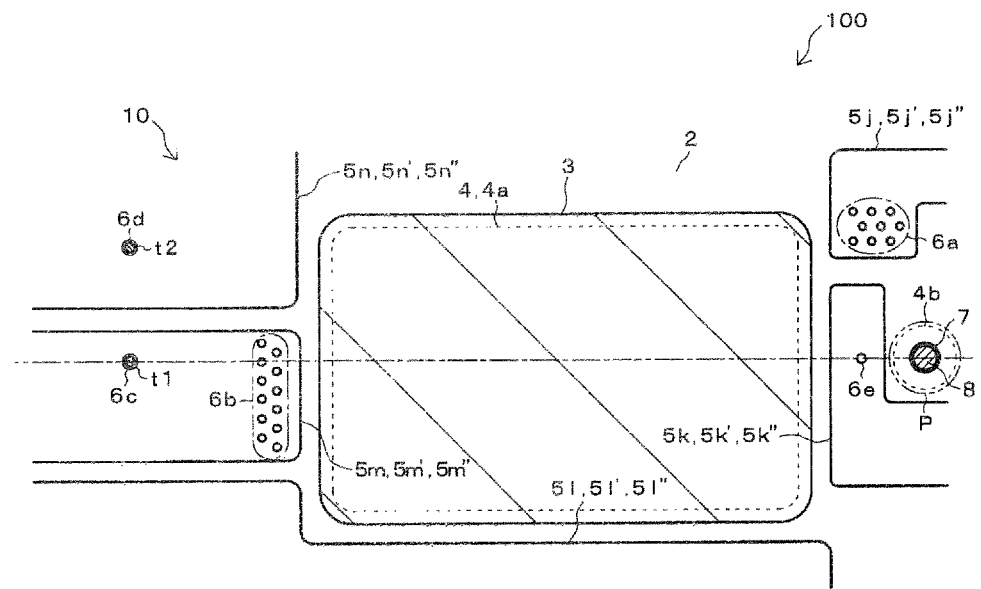
FIG. 3 is a diagram showing inner layers of the printed circuit board in FIG. 1.
Figure 4:
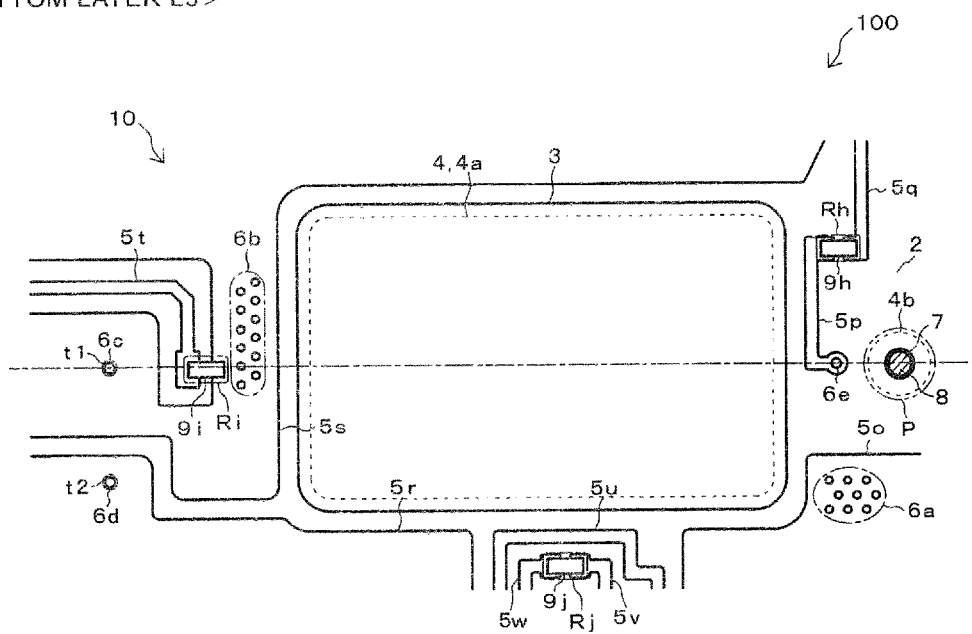
FIG. 4 is a diagram showing a bottom layer of the printed circuit board in FIG. 1.

FIG. 1 is a diagram showing a top layer L1 on an upper surface of the printed circuit board 10. FIG. 2 is a diagram showing a cross-section along A-A in FIG. 1. FIG. 3 is a diagram showing inner layers L2, L3, L4 that are present inside of the printed circuit board 10. FIG. 4 is a diagram showing a bottom layer L5 that is present on a lower surface of the printed circuit board 10. Note that FIGS. 1 and 3 each show a state seen from above the printed circuit board 10, and FIG. 4 shows a state seen from below the printed circuit board 10. In each drawing, the printed circuit board 10 and the electronic device 100 are only partially shown for the sake of convenience.

The electronic device 100 is, for example, a DC-DC converter mounted on an electric car or a hybrid car. The electronic device 100 includes the printed circuit board 10, electronic components 9a to 9j, and a heat sink 4.

As shown in FIG. 2, the printed circuit board 10 is a multilayer board having the surface layers L1, L5 provided respectively on the upper and lower surfaces, and the plurality of inner layers L2, L3, L4 provided inside thereof. The printed circuit board 10 includes a first insulating layer 1, a second insulating layer 2, a metal core 3, a heat sink 4, wiring patterns 5a to 5w, and through holes 6a to 6e (see also FIGS. 1, 3, and 4).

The first insulating layer 1 includes a highly thermally conductive prepreg 1a. The highly thermally conductive prepreg 1a is, for example, a prepreg having high thermal conductivity and an insulation property which is produced by, for example, mixing an epoxy with an aluminum oxide. The first insulating layer 1 is formed into a flat plate shape having a predetermined thickness (about 100 μm).

The top layer L1 is provided on an upper surface of the first insulating layer 1 exposed to the outside. As shown in FIG. 1, mounting regions Ra to Rg for the electronic components 9a to 9g, and the wiring patterns 5a to 5i are provided on the top layer L1.

The wiring patterns 5a to 5i are made of copper foils having electrical conductivity and thermal conductivity. Parts of the wiring patterns 5a to 5i function as lands for soldering the electronic components 9a to 9g.

Field effect transistors (FETs) 9a, 9b are mounted in the mounting regions Ra, Rb, respectively. A discrete component 9c is mounted in the mounting regions Rc. Chip capacitors 9d to 9g are mounted in the mounting regions Rd to Rg, respectively.

The FET 9a, 9b are surface mount electronic components which generate a large amount of heat. A source terminal s1 of the FET 9a is soldered on the wiring pattern 5a. A gate terminal g1 of the FET 9a is soldered on the wiring pattern 5b. A drain terminal d1 of the FET 9a is soldered on the wiring pattern 5c. A source terminal s2 of the FET 9b is soldered on the wiring pattern 5c. A gate terminal g2 of the FET 9b is soldered on the wiring pattern 5d. A drain terminal d2 of the FET 9b is soldered on the wiring pattern 5e.

As shown in FIG. 2, the discrete component 9c is an electronic component including lead terminals t1, t2 (FIG. 1) penetrating the printed circuit board 10. A main body of the discrete component 9c is mounted on the upper surface of the first insulating layer 1. The lead terminals t1, t2 of the discrete component 9c are inserted respectively into the through holes 6c, 6d and then soldered.

The chip capacitors 9d to 9g are surface mount electronic components. As shown in FIG. 1, the chip capacitor 9d is soldered on the wiring patterns 5b, 5h. The chip capacitor 9e is soldered on the wiring patterns 5e, 5f. The chip capacitor 9f is soldered on the wiring patterns 5d, 5i. The chip capacitor 9g is soldered on the wiring patterns 5e, 5g.

As shown in FIG. 2, the second insulating layer 2 is provided so as to be in contact with a lower surface of the first insulating layer 1. The second insulating layer 2 is constituted by bonding a copper-clad laminate 2a to each of upper and lower surfaces of an ordinary prepreg 2b impregnated with a synthetic resin. The ordinary prepreg 2b means a prepreg serving as a material for a general printed circuit board. The copper-clad laminate 2a is a laminate in which copper foils are attached to both upper and lower surfaces of a plate member made of a synthetic resin such as an epoxy containing glass fiber. Accordingly, the second insulating layer 2 is formed into a flat plate shape which is thicker than the first insulating layer 1, and has a laminate structure.

Moreover, the second insulating layer 2 has two types of insulating portions, that is, the ordinary prepreg 2b and a core (made of a synthetic resin) 2c of the copper-clad laminate 2a. The insulating portions 2b, 2c are of different materials, and the thickness of each of the insulating portions 2b, 2c is the same as the thickness of the first insulating layer 1. Note that in another example, the insulating portions 2b, 2c may have different thicknesses.

With use of a copper foil portion of each copper-clad laminate 2a of the second insulating layer 2, the inner layer L2 is provided between the first insulating layer 1 and the second insulating layer 2, the inner layers L3, L4 are provided inside of the second insulating layer 2, and the bottom layer L5 is provided on a lower surface of the second insulating layer 2.

As shown in FIG. 3, the wiring patterns 5j to 5n, 5j' to 5n', 5j" to 5n" are provided on the inner layers L2 to L4. Each of the wiring patterns 5j to 5n, 5j' to 5n', 5j" to 5n" is made of a copper foil having electrical conductivity and thermal conductivity.

In the present example, each of the wiring patterns 5j, 5k, 5l, 5m, 5n on the inner layer L2, the wiring patterns 5j', 5k', 5l', 5m', 5n' on the inner layer L3, and the wiring patterns 5j", 5k", 5l", 5m", 5n" on the inner layer L4 has the same shape. In another example, the wiring patterns on the inner layers L2, L3, L4 may have different shapes. The inner layer L2 is an example of a "first inner layer" according to one or more embodiments, and the inner layers L3, L4 are examples of a "second inner layer" according to one or more embodiments.

As shown in FIG. 4, the mounting regions Rh to Rj for the electronic components 9h to 9j, and the wiring patterns 5o to 5w are provided on the bottom layer L5. The wiring patterns 5o to 5w are made of copper foils having electrical conductivity and thermal conductivity. Parts of the wiring patterns 5p, 5q, 5s, 5t, 5v, 5w function as lands for soldering the electronic components 9h to 9j.

The electronic components 9h to 9j are surface mount chip capacitors. The chip capacitor 9h is soldered on the wiring patterns 5p, 5q. The chip capacitor 9i is soldered on the wiring patterns 5t, 5s. The chip capacitor 9j is soldered on the wiring patterns 5v, 5w.

As shown in FIG. 2, the metal core 3 is embedded in the second insulating layer 2. The metal core 3 is provided in a wide range so as to be in contact with the lower surface of the first insulating layer 1, and so as to vertically partially or entirely overlap the plurality of mounting regions Ra, Rb, Rd, Rf and the plurality of wiring patterns 5a to 5e, 5h, 5i (FIG. 1) provided on the top layer L1. That is, the metal core 3 is covered with the first insulating layer 1 from above, and its entire side surface is covered with the second insulating layer 2.

The metal core 3 is made of metal having electrical conductivity and thermal conductivity, such as copper. As shown in FIGS. 1 and 4, the metal core 3 is formed into a rectangular shape as seen from above or below.

The metal core 3 is formed into a predetermined shape by stamping out a metal plate in the thickness direction by a press machine. Accordingly, as shown in FIG. 2, one outer surface 3c orthogonal to the thickness direction (the top-down direction in FIG. 2) of the metal core 3 becomes a protruding surface having a curved portion (hereinafter referred to as a "shear droop") 3d formed at its edge. Moreover, the other outer surface 3a orthogonal to the thickness direction of the metal core 3 becomes a recessed surface having a protruding portion (hereinafter referred to as a "burr") 3b formed at its edge.

The protruding surface 3c of the metal core 3 is in contact with the lower surface of the first insulating layer 1. The recessed surface 3a and the burr 3b of the metal core 3 are exposed from the lower surface of the second insulating layer 2. The metal core 3 is an example of a "heat transfer member" according to one or more embodiments.

A thermal conductivity of the metal core 3 is higher than a thermal conductivity of the first insulating layer 1. The thermal conductivity of the first insulating layer 1 is higher than a thermal conductivity of the second insulating layer 2. Specifically, for example, the thermal conductivity of the second insulating layer 2 is 0.3 to 0.5 W/mK (mK: meter-Kelvin), while the thermal conductivity of the first insulating layer 1 is 3 to 5 W/mK. Moreover, in the case where the metal core 3 is made of copper, the thermal conductivity of the metal core 3 is about 400 W/mK.

In the top layer L1, the first insulating layer 1 is interposed between the wiring patterns 5a to 5e, 5h, 5i and the electronic components 9a, 9b, 9d, 9f present above the metal core 3, and the metal core 3. Accordingly, the wiring patterns 5a to 5e, 5h, 5i and the electronic components 9a, 9b, 9d, 9f are insulated from the metal core 3.

In each of the inner layers L2 to L4, a prepreg of the second insulating layer 2 is interposed between the wiring patterns 5j to 5n, 5j' to 5n', 5j" to 5n" present near the metal core 3, and the metal core 3. Accordingly, the wiring patterns 5j to 5n, 5j' to 5n', 5j" to 5n" are insulated from the metal core 3.

In the bottom layer L5, the wiring patterns 5o, 5p, 5r, 5s, 5u present near the metal core 3 and the metal core 3 are separated by a predetermined insulation distance. Accordingly, the wiring patterns 5o, 5p, 5r, 5s, 5u, and the electronic components 9h, 9i mounted on the wiring patterns 5p, 5s are insulated from the metal core 3.

The through holes 6a to 6e penetrate the first insulating layer 1, the second insulating layer 2, and the wiring patterns present on both the insulating layers 1, 2 (FIG. 2). An inner surface of each of the through holes 6a to 6e is copper or solder plated. The through holes 6a to 6e connect the wiring patterns present on different layers L1 to L5 to one another. The through holes 6a to 6e are insulated from the metal core 3 by the insulating layers 1, 2. The through holes 6a to 6e are examples of a "through conductor" according to one or more embodiments.

Specifically, as shown in FIGS. 1 to 4, a plurality of the through holes 6a are provided so as to penetrate the insulating layers 1, 2, the wiring pattern 5a on the top layer L1, the wiring patterns 5j, 5j', 5j" on the inner layers L2 to L4, and the wiring pattern 5o on the bottom layer L5. Each through hole 6a connects the wiring patterns 5a, 5j, 5j', 5j", 5o.

A plurality of the through holes 6b are provided so as to penetrate the insulating layers 1, 2, the wiring pattern 5e on the top layer L1, the wiring patterns 5m, 5m', 5m" on the inner layers L2 to L4, and the wiring pattern 5s on the bottom layer L5. Each through hole 6b connects the wiring patterns 5e, 5m, 5m', 5m", 5s.

The through hole 6c is provided so as to penetrate the insulating layers 1, 2, the wiring pattern 5e on the top layer L1, the wiring patterns 5m, 5m', 5m" on the inner layers L2 to L4, and the wiring pattern 5s on the bottom layer L5. The one lead terminal t1 of the discrete component 9c is soldered to the through hole 6c, and the lead terminal t1 and the wiring patterns 5e, 5m, 5m', 5m", 5s are connected.

The through hole 6d is provided so as to penetrate the insulating layers 1, 2, the wiring pattern 5f on the top layer L1, the wiring patterns 5n, 5n', 5n" on the inner layers L2 to L4, and the wiring pattern 5r on the bottom layer L5. The other lead terminal t2 of the discrete component 9c is soldered to the through hole 6d, and the lead terminal t2 and the wiring patterns 5f, 5n, 5n', 5n", 5r are connected.

The through hole 6e is provided so as to penetrate the insulating layers 1, 2, the wiring pattern 5h on the top layer L1, the wiring patterns 5k, 5k', 5k" on the inner layers L2 to L4, and the wiring pattern 5p on the bottom layer L5. The through hole 6e connects the wiring patterns 5h, 5k, 5k', 5k", 5p.

As shown in FIG. 2, the heat sink 4 is provided below the second insulating layer 2 and the metal core 3 of the printed circuit board 10. The heat sink 4 is made of metal such as aluminum, and emits heat generated by the printed circuit board 10 to the outside and cools the printed circuit board 10. The heat sink 4 is an example of a "heat dissipation member" according to one or more embodiments.

A first base 4a and a second base 4b are formed on an upper surface of the heat sink 4 so as to protrude upward. An upper surface of each of the bases 4a, 4b is in parallel with a board surface of the printed circuit board 10. As seen from above the printed circuit board 10, the area of the first base 4a is smaller than the area of the metal core 3 as shown in FIG. 1.

A threaded hole 4h is formed on the second base 4b in parallel with the thickness direction (the top-down direction in FIG. 2) of the printed circuit board 10. In each of the insulating layers 1, 2, a penetration hole 7 is provided in a non-overlapping region P not overlapping the mounting regions Ra to Rj and the wiring patterns 5a to 5w. As seen from above the printed circuit board 10, the area of the second base 4b is slightly smaller than the area of each non-overlapping region P as shown in FIG. 1. Moreover, the area of the second base 4b is greater than the area of the penetration hole 7 (see FIGS. 3 and 4).

When the second base 4b is brought into contact with the non-overlapping region P on the lower surface of the printed circuit board 10, the penetration hole 7 and the threaded hole 4h are brought into communication with each other. Then, when a screw 8 penetrates the penetration hole 7 from above the first insulating layer 1 and is screwed into the threaded hole 4h, the second base 4b is fixed to the lower surface of the second insulating layer 2, as shown in FIG. 2. The printed circuit board 10 is fixed on the heat sink 4 by providing a plurality of such screwing locations. As shown in FIG. 1, the area of a head of the screw 8 is smaller than the area of the non-overlapping region P. The screw 8 is an example of a "screw member" according to one or more embodiments.

As shown in FIG. 2, in a state where the heat sink 4 and the printed circuit board 10 are fixed to each other, the upper surface of the first base 4a is in contact with a region inside of the burr 3b on the recessed surface 3a of the metal core 3.

Thermal grease having high thermal conductivity (not shown) may be applied on the upper surface of the first base 4a, for example. This increases close contact between the upper surface of the first base 4a and the recessed surface 3a of the metal core 3, and increases thermal conductivity from the metal core 3 to the heat sink 4.

An indentation 4c is provided around the first base 4a on the heat sink 4 so as to avoid the electronic components 9h to 9j and the wiring patterns 5o to 5w provided on the lower surface of the second insulating layer 2 and the burr 3b on the recessed surface 3a of the metal core 3.

Next, a manufacturing method of the printed circuit board 10 will be described with reference to FIGS. 5A and 5B.

Figure 5A:
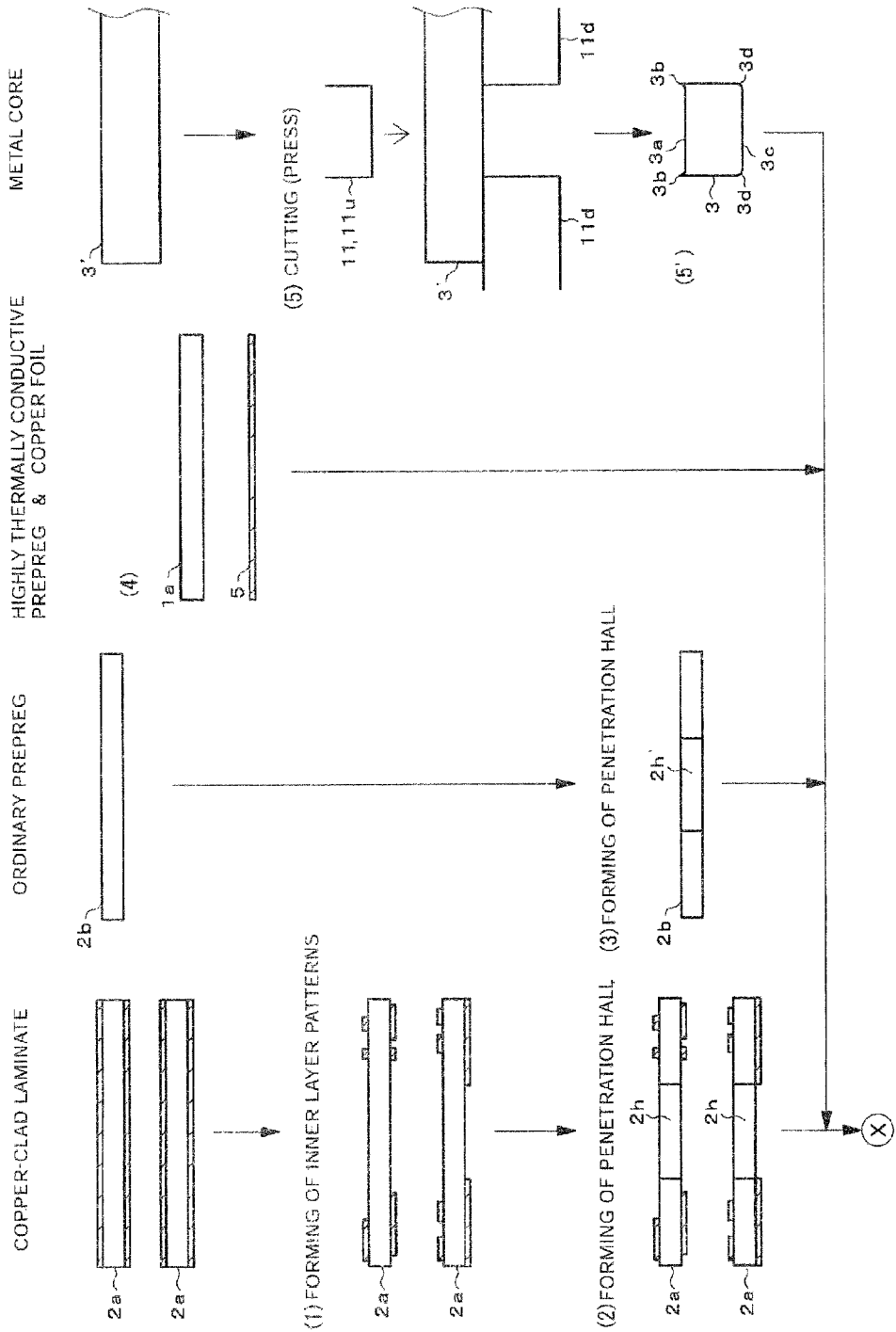
FIG. 5A is a diagram showing manufacturing steps of the printed circuit board in FIG. 1.
Figure 6:
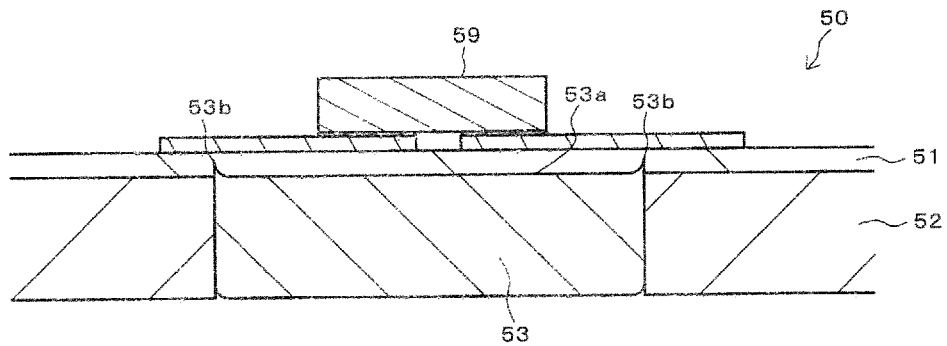
FIG. 6 is a diagram for describing a conventional technique causing a burr of a heat transfer member.

FIGS. 5A and 5B are diagrams showing manufacturing steps of the printed circuit board 10. Note that in FIGS. 5A and 5B, each part of the printed circuit board 10 is shown in a simple manner for the sake of convenience.

In FIG. 5A, the wiring patterns 5j to 5n, 5j' to 5n' (reference signs are omitted in FIGS. 5A and 5B) on the inner layers L2, L3 are formed by, for example, etching the copper foils present on upper and lower surfaces of one of two copper-clad laminates 2a. Moreover, the wiring patterns 5j'' to 5n'' (reference signs are omitted in FIGS. 5A and 5B) on the inner layer L4 are formed by, for example, etching the copper foil present on an upper surface of the other copper-clad laminate 2a (FIG. 5A, (1)).

Next, a penetration hole 2h for fitting the metal core 3 is formed on each copper-clad laminate 2a (FIG. 5A, (2)). Moreover, a penetration hole 2h' for fitting the metal core 3 is formed also on the ordinary prepreg 2b (FIG. 5A, (3)).

Moreover, the highly thermally conductive prepreg 1a having a predetermined thickness, and a copper foil 5 having a predetermined thickness, which is to be attached to an upper surface of the prepreg 1a, are prepared (FIG. 5A, (4)).

Further, the metal core 3 having a predetermined shape is formed by cutting a metal plate 3' such as a copper plate with a press machine 11 and stamping out the metal plate 3' in the thickness direction (FIG. 5A, (5), (5')). At this time, the upper surface 3a of the metal core 3 on which an upper die flu of the press machine 11 abuts becomes the recessed surface having the burr 3b caused at its edge. Moreover, the lower surface 3c of the metal core 3 on which a lower die 11d of the press machine 11 abuts becomes the protruding surface having the shear droop 3d caused at its edge. The lower surface 3c corresponds to "one outer surface" according to one or more embodiments, and the upper surface 3a corresponds to the "other outer surface" according to one or more embodiments.

In another example, the metal core may be formed by cutting a metal plate into a predetermined shape with a wire cutter. Again in this case, one outer surface orthogonal to the thickness direction of the metal core becomes a protruding surface having a shear droop caused at its edge. Moreover, the other outer surface orthogonal to the thickness direction of the metal core becomes a recessed surface having a burr caused at its edge.

Next, as shown in (6) in FIG. 5B, the one copper-clad laminate 2a, the ordinary prepreg 2b, and the other copper-clad laminate 2a are stacked in this order from the bottom, and the metal core 3 is fitted into their penetration holes 2h, 2h'. At this time, the metal core 3 is inserted from the protruding surface 3c into the penetration holes 2h, 2h' from below the one copper-clad laminate 2a. Then, the highly thermally conductive prepreg 1a and the copper foil 5 are stacked thereabove in this order, and then crimping is performed in the top-down direction (the thickness direction of each member) while heat is applied.

Accordingly, the synthetic resin of each of the prepregs 2b, 1a is melted and enters a gap between members and the members are bonded, and the second insulating layer 2, the first insulating layer 1, and the inner layers L2 to L4 are constituted (FIG. 5B, (6')). Moreover, the protruding surface 3c of the metal core 3 is in contact with the lower surface of the first insulating layer 1, and the entire side surface of the metal core 3 is in contact with the second insulating layer 2. Further, the recessed surface 3a and the burr 3b of the metal core 3 are exposed from the lower surface of the second insulating layer 2.

Next, holes are made at predetermined locations and inner surfaces of the holes are plated, thereby the through holes 6a to 6e (indicated by reference sign 6 in FIG. 5B) are formed (FIG. 5B, (7)). Next, the copper foil 5 at a topmost part is subjected to etching and the like, and the wiring patterns 5a to 5i (reference signs are omitted in FIG. 5B) on the top layer L1 are formed on the upper surface of the first insulating layer 1. Moreover, the copper foil at a bottom part is subjected to etching and the like, and the wiring patterns 5o to 5w (reference signs are omitted in FIG. 5B) on the bottom layer L5 are formed on the lower surface of the second insulating layer 2 (FIG. 5B, (8)). At this time, the mounting regions Ra to Rj (FIGS. 1, 4) for the electronic components are also provided on both the surface layers L1, L5.

After that, surface treatment such as resist printing and silk printing is performed on the upper surface of the first insulating layer 1, the wiring patterns 5a to 5i, the lower surface of the second insulating layer 2, the wiring patterns 5o to 5w, and the like which are exposed (FIG. 5B, (9)). Then, an outer shape is processed by cutting unnecessary end portions of each of the insulating layers 1, 2 (FIG. 5B, (10)). The printed circuit board 10 is thereby formed.

According to the embodiment described above, the metal core 3 is embedded in the second insulating layer 2 of the printed circuit board 10, and the electronic components 9a, 9b, 9d, 9f are mounted above the metal core 3 through the first insulating layer 1 and the wiring patterns 5a to 5e, 5h, 5i. Moreover, the protruding surface 3c of the metal core 3, on which the shear droop 3d is formed, is in contact with the lower surface of the first insulating layer 1, and the recessed surface 3a of the metal core 3, on which the burr 3b is formed, is exposed from the lower surface of the second insulating layer 2. Then, the upper surface of the first base 4a of the heat sink 4 is in contact with the recessed surface 3a of the metal core 3.

Accordingly, the protruding surface 3c of the metal core 3 can be brought into close contact with the first insulating layer 1, and heat generated by the electronic components 9a, 9b, 9d, 9f can be transferred easily to the metal core 3 through the wiring patterns 5a to 5e, 5h, 5i and the first insulating layer 1. Then, the heat can be transferred from the recessed surface 3a of the metal core 3 to the heat sink 4, and can be dissipated efficiently from the heat sink 4 to the outside.

Moreover, since the burr 3b of the metal core 3 is disposed toward the outside of the printed circuit board 10, the first insulating layer 1 is prevented from being damaged by the burr 3b. As a result, insulation performance of the first insulating layer 1 insulating the electronic components 9a, 9b, 9d, 9f and the wiring patterns 5a to 5e, 5h, 5i on the printed circuit board 10 from the metal core 3 can be prevented from being impaired.

Moreover, since the first insulating layer 1 is provided on the upper surfaces of the metal core 3 and the second insulating layer 2, the plurality of electronic components 9a, 9b, 9d, 9f can be mounted easily above the metal core 3 in a state where the plurality of electronic components 9a, 9b, 9d, 9f are insulated from the metal core 3. Moreover, the plurality of wiring patterns 5a to 5e, 5h, 5i can also be formed easily above the metal core 3 in a state where the plurality of wiring patterns 5a to 5e, 5h, 5i are insulated from the metal core 3. Accordingly, an electrical circuit can be formed easily on the upper surface of the printed circuit board 10, to increase mounting density of the printed circuit board 10. Moreover, heat generated by the plurality of electronic components 9a, 9b, 9d, 9f can be transferred to the heat sink 4 through the first insulating layer 1 and the metal core 3, and can be dissipated collectively and efficiently.

In the embodiment described above, the thermal conductivity of the first insulating layer 1 is higher than the thermal conductivity of the second insulating layer 2, and the thermal conductivity of the metal core 3 is higher than the thermal conductivity of the first insulating layer 1. Accordingly, heat generated by the electronic components 9a, 9b, 9d, 9f mounted above the metal core 3 can be transferred easily to the metal core 3 through the first insulating layer 1. Then, the heat can be transferred to the heat sink 4 from the recessed surface 3a of the metal core 3, which is exposed from the second insulating layer 2, and the heat can be dissipated from the heat sink 4 to the outside further efficiently.

In the embodiment described above, the wiring patterns 5j to 5n, 5j' to 5n', 5j" to 5n" are provided respectively on the inner layer L2 present between the first insulating layer 1 and the second layer 2, and the inner layers L3, L4 present inside of the second insulating layer 2. Then, the wiring patterns 5j to 5n, 5j' to 5n', 5j" to 5n" are insulated from the metal core 3 by the insulating layers 1, 2. Accordingly, heat generated by the electronic components 9a to 9g mounted on the upper surface of the first insulating layer 1 can be transferred to the first insulating layer 1 and the metal core 3, and then can be diffused over the entire printed circuit board 10 by the wiring patterns 5j to 5n, 5j' to 5n', 5j" to 5n" on the inner layers L2 to L4. Moreover, the metal core 3 is fitted from the protruding surface 3c side having no burr 3b into the penetration holes 2h, 2h' of the second insulating layer 2, and thus side wall portions of the penetration holes 2h, 2h' of the second insulating layer 2 are prevented from being damaged by the burr 3b at the time of fitting, and insulation performance of the second insulating layer 2 can be prevented from being impaired.

In the embodiment described above, the mounting regions Rh to Rj for the electronic components 9h to 9j and the wiring patterns 5o to 5w are provided on the lower surface of the second insulating layer 2. Moreover, the electronic components 9h to 9j and the wiring patterns 5o to 5w are insulated from the metal core 3. Accordingly, heat generated by the electronic components 9a to 9g on the upper surface and diffused over the entire printed circuit board 10, and heat generated by the electronic components 9h to 9j on the lower surface can be dissipated to below the printed circuit board 10. Moreover, an electrical circuit can be formed easily also on the lower surface of the printed circuit board 10, to further increase mounting density of the printed circuit board 10. Further, even though the recessed surface 3a of the metal core 3, which has the burr 3b, is exposed from the lower surface of the second insulating layer 2, the electronic components 9h to 9j and the wiring patterns 5o to 5w on the lower surface of the second insulating layer 2 can be insulated reliably from the metal core 3.

In the embodiment described above, the wiring patterns 5a, 5e, 5f, 5h, 5j, 5k, 5m, 5n, 5j', 5k', 5m', 5n', 5j", 5k", 5m", 5n", 5o, 5p, 5r, 5s provided on the upper surface of the first insulating layer 1, inside of the second insulating layer 2, and on the lower surface of the second insulating layer 2 are connected by the through holes 6a to 6e. Accordingly, heat generated by the electronic components 9a to 9g and transferred to the wiring patterns 5a, 5e, 5f, 5h on the upper surface of the printed circuit board 10 can be transferred to the wiring patterns 5j, 5k, 5m, 5n, 5j', 5k', 5m', 5n', 5j", 5k", 5m", 5n" present inside thereof through the through holes 6a to 6e, and can be diffused to the entire printed circuit board 10. Moreover, the heat can also be transferred to the wiring patterns 5o, 5p, 5r, 5s on the lower surface, and can be dissipated below from the surfaces of the wiring patterns 5o, 5p, 5r, 5s or can be dissipated through the metal core 3 and the heat sink 4. Moreover, since the through holes 6a to 6e are provided at positions at which the through holes 6a to 6e do not vertically overlap the metal core 3, the through holes 6a to 6e can be insulated from the metal core 3 by the insulating layers 1, 2.

Figure 7:
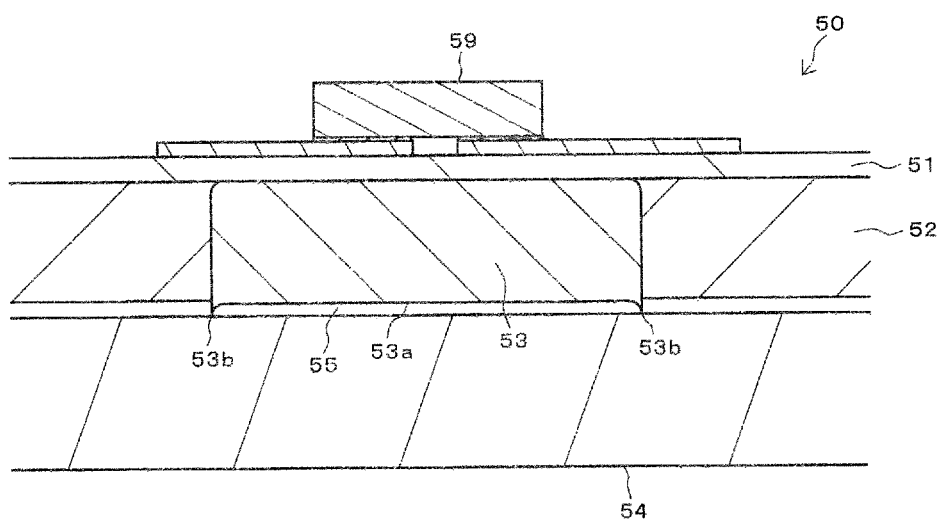
FIG. 7 is a diagram for describing another conventional technique causing a burr of the heat transfer member.

As shown in FIG. 7 for example, when a heat transfer member 53 is mounted on an upper surface of a flat heat sink 54 not having a base, the heat transfer member 53 is supported on the heat sink 54 by a burr 53b, and a gap 55 is caused between a region inside of the burr 53b on a recessed surface 53a and the upper surface of the heat sink 54. Accordingly, heat generated by an electronic component 59 present above the heat transfer member 53 is not easily transferred from the heat transfer member 53 to the heat sink 54 after going through an insulating layer 51, and heat dissipation performance is impaired.

On the other hand, in the embodiment described above, as shown in FIG. 2, since the upper surface of the first base 4a of the heat sink 4 is in contact with the region inside of the burr 3b on the recessed surface 3a of the metal core 3, no gap is caused between the metal core 3 and the first base 4a. Accordingly, heat generated by the electronic components 9a, 9b, 9d and the like present above the metal core 3 can be transferred easily from the metal core 3 to the heat sink 4 after going through the first insulating layer 1, and can be dissipated efficiently.

Moreover, in the embodiment described above, interference between the electronic components 9h to 9j and the wiring patterns 5o to 5w provided on the lower surface of the second insulating layer 2, and the burr 3b on the recessed surface 3a of the metal core 3 is avoided by providing the indentation 4c on the heat sink 4. Accordingly, the electronic components 9h to 9j and the wiring patterns 5o to 5w can be insulated from the heat sink 4. Additionally, since the burr 3b is not in contact with the heat sink 4, no gap is caused between the metal core 3 and the heat sink 4, thereby heat dissipation performance can be prevented from being impaired.

Further, in the embodiment described above, the upper surface of the second base 4b of the heat sink 4 is brought into contact with the non-overlapping region P not overlapping the mounting regions Ra to Rj, the wiring patterns 5a to 5w and the metal core 3 of the printed circuit board 10, and the printed circuit board 10 is screwed to the second base 4b. Accordingly, the printed circuit board 10 can be fixed on the heat sink 4 while the electronic components 9a to 9j, the wiring patterns 5a to 5w and the through holes 6a to 6e provided on the printed circuit board 10 are insulated from the heat sink 4.

The present invention can adopt various embodiments other than the embodiment described above. For example, in FIG. 2, the burr 3b and the shear droop 3d are shown with exaggeration as compared to the actual burr and shear droop for the sake of convenience, but the burr 3b and the shear droop 3d are not limited to those that can be observed visually, and may be a small burr and shear droop that cannot be observed visually.

The above embodiment describes the example where the through holes 6a to 6e are provided in order to realize conduction in the wiring patterns present on the upper surface of the first insulating layer 1, inside of the second insulating layer 2 and on the lower surface of the second insulating layer 2 of the printed circuit board 10, but the present invention is not limited thereto. Other than such an example, for example, conductors such as copper terminals and pins may be provided so as to penetrate the printed circuit board, and the wiring patterns on different layers may be connected to one another.

The above embodiment describes the example where the shape of the metal core 3 as seen from above is a rectangular shape, but the shape of the metal core 3 is not limited thereto. The shape of the metal core as seen from above may be any shape in accordance with a position for disposition or a shape of an electronic component that generates heat.

The above embodiment describes the example where the heat sink 4 is used as a heat dissipation member, but an air-cooling or water-cooling radiator, a radiator using a cooling medium, or the like may be used instead of the heat sink. Moreover, not only a heat dissipation member made of metal but also a heat dissipation member formed of a resin with high thermal conductivity may be used.

The above embodiment describes the example where the screw 8 is used as a screw member, but a bolt or the like may be used instead of the screw. Moreover, the heat dissipation member may be attached below the printed circuit board by other fixing tools.

The above embodiment describes the example where one or more embodiments are applied to the printed circuit board 10 provided with the two surface layers L1, L5 and the three inner layers L2 to L4, but one or more embodiments can also be applied to a single-layer printed circuit board having conductors such as wiring patterns provided only on an upper surface, or a printed circuit board having conductors provided on two or more layers.

Further, the above embodiment describes a DC-DC converter mounted on an electric car or a hybrid car as an example of the electronic device 100, but one or more embodiments can be applied to any other electronic device including a printed circuit board, an electronic component that generates heat, and a heat dissipation member.

REFERENCE SIGNS LIST

1 First insulating layer
2 Second insulating layer
3 Metal core (heat transfer member)
3' Metal plate
3a Recessed surface
3b Burr (protruding portion)
3c Protruding surface
3d Shear droop (curved portion)
4 Heat sink (heat dissipation member)
4a First base
4b Second base
4c Indentation
4h Threaded hole
5a to 5i Wiring pattern on top layer
5j to 5n, 5j' to 5n', 5j" to 5n" Wiring pattern on inner layer
5o to 5w Wiring pattern on bottom layer
6a to 6e Through hole (through conductor)
7 Penetration hole
8 Screw (screw member)
9a, 9b FET (electronic component)
9c Discrete component (electronic component)
9d to 9j Chip capacitor (electronic component)
10 Printed circuit board
100 Electronic device
L2 Inner layer (first inner layer)
L3, L4 Inner layer (second inner layer)
P Non-overlapping region
Ra to Rj Mounting region Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims

What is claimed is:

1. A printed circuit board comprising:
a first insulating layer having a mounting region for an electronic component and a wiring pattern provided on an upper surface;
a second insulating layer provided so as to be in contact with a lower surface of the first insulating layer; and
a heat transfer member embedded in the second insulating layer so as to vertically overlap the mounting region,
wherein the heat transfer member is formed into a predetermined shape by cutting a metal plate,
wherein one outer surface orthogonal to a thickness direction of the heat transfer member is a protruding surface having a curved portion formed at its edge, and is in contact with the lower surface of the first insulating layer, and
wherein the other outer surface orthogonal to the thickness direction of the heat transfer member is a recessed surface having a protruding portion formed at its edge, and is exposed from a lower surface of the second insulating layer.

2. The printed circuit board according to claim 1, wherein the recessed surface of the heat transfer member is in contact with a heat dissipation member that is provided below the second insulating layer.

3. The printed circuit board according to claim 1, wherein a thermal conductivity of the first insulating layer is higher than a thermal conductivity of the second insulating layer, and
wherein a thermal conductivity of the heat transfer member is higher than the thermal conductivity of the first insulating layer.

4. The printed circuit board according to claim 1, wherein the second insulating layer has a laminate structure,
wherein a wiring pattern is provided on each of a first inner layer that is present between the first insulating layer and the second insulating layer, and a second inner layer that is present inside of the second insulating layer, and wherein the wiring patterns on the first inner layer and the second inner layer are insulated from the heat transfer member.

5. The printed circuit board according to claim 1,
wherein a mounting region for an electronic component and a wiring pattern are provided on the lower surface of the second insulating layer, and
wherein the mounting region and the wiring pattern on the lower surface of the second insulating layer are insulated from the heat transfer member.

6. The printed circuit board according to claim 5, further comprising:
a through conductor penetrating the first insulating layer and the second insulating layer to connect the wiring patterns present on both the insulating layers,
wherein the through conductor is insulated from the heat transfer member.

7. An electronic device comprising:
the printed circuit board according to claim 1;
an electronic component that generates heat, which is mounted in the mounting region of the printed circuit board; and
a heat dissipation member provided below the printed circuit board,
wherein a first base protruding upward is provided on an upper surface of the heat dissipation member, and
wherein the first base is in contact with a region inside of the protruding portion on the recessed surface of the heat transfer member provided on the printed circuit board.

8. The electronic device according to claim 7,
wherein an indentation for avoiding an electronic component and a wiring pattern provided on a lower surface of the second insulating layer of the printed circuit board and the protruding portion on the recessed surface of the heat transfer member is provided on the upper surface of the heat dissipation member.

9. The electronic device according to claim 7,
wherein a penetration hole is provided in a non-overlapping region not overlapping the mounting region, the wiring pattern and the heat transfer member of the printed circuit board,
wherein a second base protruding upward is provided on the upper surface of the heat dissipation member, separately from the first base,
wherein the second base is in contact with the non-overlapping region of the printed circuit board,
wherein a threaded hole is provided on the second base so as to be in communicating with the penetration hole, and
wherein the printed circuit board is fixed on the heat dissipation member by a screw member penetrating the penetration hole from above the printed circuit board and being screwed into the threaded hole.

* * * * *